United States Patent
Davis et al.

(10) Patent No.: US 6,469,518 B1
(45) Date of Patent: Oct. 22, 2002

(54) METHOD AND APPARATUS FOR DETERMINING MEASUREMENT FREQUENCY BASED ON HARDWARE AGE AND USAGE

(75) Inventors: Bradley M. Davis, Austin, TX (US); Allen L. Evans, Austin, TX (US); Craig W. Christian, Buda, TX (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/479,180

(22) Filed: Jan. 7, 2000

(51) Int. Cl.⁷ ............... G01R 27/00; G05B 13/02; G06F 19/00
(52) U.S. Cl. ............... 324/600; 700/31; 700/97; 700/109; 700/121
(58) Field of Search ............... 324/600; 700/31, 700/109, 97; 702/100

(56) References Cited

U.S. PATENT DOCUMENTS

| | | | | |
|---|---|---|---|---|
| 4,795,260 A | * | 1/1989 | Schuur et al. | 356/400 |
| 5,117,377 A | * | 5/1992 | Finman | 703/2 |
| 5,227,626 A | * | 7/1993 | Okada et al. | 250/234 |
| 5,274,434 A | | 12/1993 | Morioka et al. | 356/237 |
| 5,408,405 A | * | 4/1995 | Mozumder et al. | 700/31 |
| 5,410,495 A | * | 4/1995 | Ramamurthi | 702/100 |
| 5,546,312 A | * | 8/1996 | Mozumder et al. | 700/97 |
| 5,751,582 A | * | 5/1998 | Saxena et al. | 700/109 |
| 5,958,148 A | * | 9/1999 | Holzapfel et al. | 134/18 |
| 6,002,989 A | | 12/1999 | Shiba et al. | 702/84 |
| 6,130,414 A | * | 10/2000 | Toprac | 219/497 |

FOREIGN PATENT DOCUMENTS

JP 55150221 * 5/1979

OTHER PUBLICATIONS

PCT International Search Report dated Apr. 12, 2000 for AMD, Inc. International Patent Application No. PCT/US00/24411.

* cited by examiner

*Primary Examiner*—N. Le
*Assistant Examiner*—Wasseem H. Hamdan
(74) *Attorney, Agent, or Firm*—Williams, Morgan & Amerson, P.C.

(57) ABSTRACT

A processing line includes a processing tool, a measurement tool, and an automatic process controller. The processing tool is adapted to process articles. The measurement tool is adapted to measure a characteristic of selected articles at a measurement frequency. The automatic process controller is adapted to change the measurement frequency based on a usage characteristic of the processing tool. A method for monitoring a processing tool includes processing a plurality of articles in the processing tool; measuring a characteristic of selected articles at a measurement frequency; and changing the measurement frequency based on a usage characteristic of the processing tool.

19 Claims, 3 Drawing Sheets

METHOD AND APPARATUS FOR DETERMINING MEASUREMENT FREQUENCY BASED ON HARDWARE AGE AND USAGE

BACKGROUND OF THE INVENTION

1. Field of the invention

This invention relates generally to semiconductor device manufacturing, and, more particularly, to a method and apparatus for determining measurement frequency based on hardware age and usage.

2. Description of the Related Art

The manufacture of most devices, such as semiconductor devices, requires a number of discrete processing steps to create the device. For the example of semiconductor devices, a number of discrete steps are needed to produce a packaged semiconductor circuit device from raw semiconductor material. The starting substrate is usually a slice of single crystal silicon referred to as a wafer. Circuits of a particular type are fabricated together in batches of wafers called "lots" or "runs". The fabrication process creates regular arrays of a circuit on the wafers of a lot. During processing, the individual wafers in a lot may go through individual processing steps one at a time or as a batch. At the completion of wafer processing, the wafers are tested to determine circuit functionality. Later the wafers are sliced, the functioning devices are packaged, and further testing occurs prior to use by the customer.

Data gathered during the course of wafer processing is used to diagnose yield problems and forms the basis of yield improvement efforts. Such performance measurements include defect count measurements, thickness measurements (i.e., indicative of deposition rate), and resistivity measurements, for example.

The number of defects is often predictable as a function of tool hardware life. The resistivity and deposition rate also change with hardware life, and/or maintenance history. For much deposition equipment, defects are more probable when the tool is first put together and at the end of its life. In a sputtering deposition tool, the source of metal to be sputtered is referred to as a target. The target is depleted as sputtering is conducted, and, thus, the target is changed frequently. The resistivity and/or deposition rate of the layer being deposited change slowly after a target change and after a wet clean.

In a chemical vapor deposition (CVD) tool, reactive gases are introduced into the processing chamber through a gas supply header, commonly referred to as a showerhead. Over time, process materials and/or byproducts collect on the showerhead, eventually leading to degraded performance. As the showerhead becomes obstructed, the deposition rate of the CVD tool decreases and becomes more erratic. The gas supplied to the showerhead often passes through an in-line filter. Over time, the filter may become obstructed, thus reducing the amount of reactive gases it passes. This reduction could also eventually cause a reduction in the deposition rate of the tool.

Current semiconductor processing techniques typically take performance measurements at a fixed rate (e.g., every fourth lot processed in a tool) or by pre-assigning a fixed percentage of lots for measurement. Because lots are not typically processed in a particular order, the percentage technique sometimes results in periods where multiple lots are measured consecutively, followed by periods where no lots are measured.

To address the stability problem identified above, preventative maintenance tasks, such as cleanings, tool refurbishment, showerhead replacement, in-line filter replacement, and target replacement, are scheduled at intervals that are less than the expected time where the likelihood of instabilities increases. These intervals, by nature, are conservative, and may result in the performance of the preventative maintenance task before it is actually necessary. Also, due to the limitations of the performance measurement intervals described above, degradation of the tool prior to the end of the preventative maintenance interval may not be readily identified. As a result defective wafers could be manufactured, necessitating costly re-work or scrapping of the wafers.

The present invention is directed to resolving one or all of the problems mentioned above.

SUMMARY OF THE INVENTION

One aspect of the present invention is seen in a processing line including a processing tool, a measurement tool, and an automatic process controller. The processing tool is adapted to process articles. The measurement tool is adapted to measure a characteristic of selected articles at a measurement frequency. The automatic process controller is adapted to change the measurement frequency based on a usage characteristic of the processing tool.

Another aspect of the present invention is seen in a method for monitoring a processing tool. The method includes processing a plurality of articles in the processing tool; measuring a characteristic of selected articles at a measurement frequency; and changing the measurement frequency based on a usage characteristic of the processing tool.

BRIEF DESCRIPTION OF THE DRAWINGS

The invention may be understood by reference to the following description taken in conjunction with the accompanying drawings, in which like reference numerals identify like elements, and in which.

Figure 1:
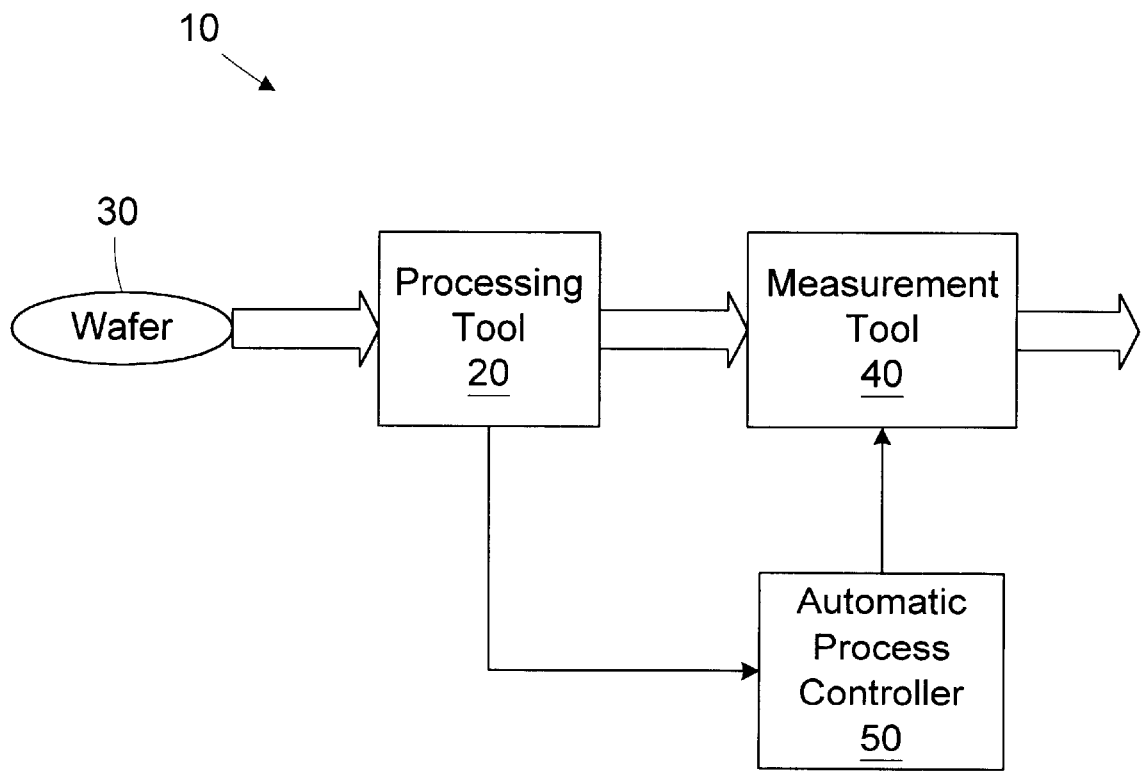
FIG. 1 is a simplified block diagram of a processing line in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the figures, and, in particular, to FIG. 1, a block diagram of a processing line 10 in accordance with the present invention is provided. The processing line 10 includes a processing tool 20 for processing semiconductor wafers 30 and a measurement tool 40 for taking performance measurements on some of the wafers 30 processed by the processing tool 20 to measure the efficacy of the process implemented by the processing tool 20. An automatic process controller 50 interfaces with the measurement tool 40 and the processing tool 20, at least in part, to determine the measurement frequency used by the measurement tool 40 based on characteristics of the processing tool 20. The measurement tool 40 may be remote from the processing tool 20 as shown, or alternatively, the measurement tool 40 may be integrated with the processing tool 20 (ie., in situ) The particular process performed by the processing tool 20 and the particular performance measurement taken by the measurement tool 40 may vary widely. Various illustrative examples will be described in greater detail hereinafter; however, application of the present invention is not limited to the particulars described in such examples. Rather, the instant invention is applicable to a wide variety of processing tools 20 related or not to semiconductor processing, and the performance measurement may be selected from a wide range of performance measurements applicable to the particular product being processed or the particular process being performed.

The automatic process controller 50 adjusts the measurement frequency of the measurement tool 40 based on usage characteristics of the processing tool 20. Exemplary usage characteristics include the time elapsed since a preventative maintenance task has been performed (e.g., cleaning) and the time elapsed since a particular part in the processing tool 20 has been replaced (e.g., target, shower head, in-line filter). The performance measurement taken by the measurement tool 40 to gauge the efficacy of the processing tool 20 may include parameters such as, but not limited to, process layer thickness, defect count, or resistivity.

In the illustrated embodiment, the automatic process controller 50 comprises a computer executing application software adapted to perform the functions described. The automatic process controller 50 may be coupled to other computers (not shown) over a computer network (not shown). Maintenance on the processing tool 20 may be tracked by a factory control system accessible to the automatic process controller 50. Alternatively, the automatic process controller 50 may receive usage characteristics via manual input from the operator of the processing tool 20.

Based on the usage characteristics derived or received by the automatic process controller 50, the measurement frequency of the measurement tool 40 is increased or decreased, based, at least in part, on the expected stability of the processing tool 20. During times of expected instability, the automatic process controller 50 increases the measurement frequency of the measurement tool 40, and during times of expected greater stability, the measurement frequency is decreased. It will be appreciated that intermediate frequencies may be used during transitions from expected periods of instability to periods of greater stability.

Exemplary period of increased instability include immediately following a cleaning operation; immediately following a target, showerhead, or in-line filter replacement; near the expected end-of-life of a target, showerhead, or filter; near the anticipated time that a cleaning should be performed, etc. Periods of greater stability may be defined as those periods other than those described above as being unstable, otherwise referred to as normal or steady-state operating conditions.

Figure 2:
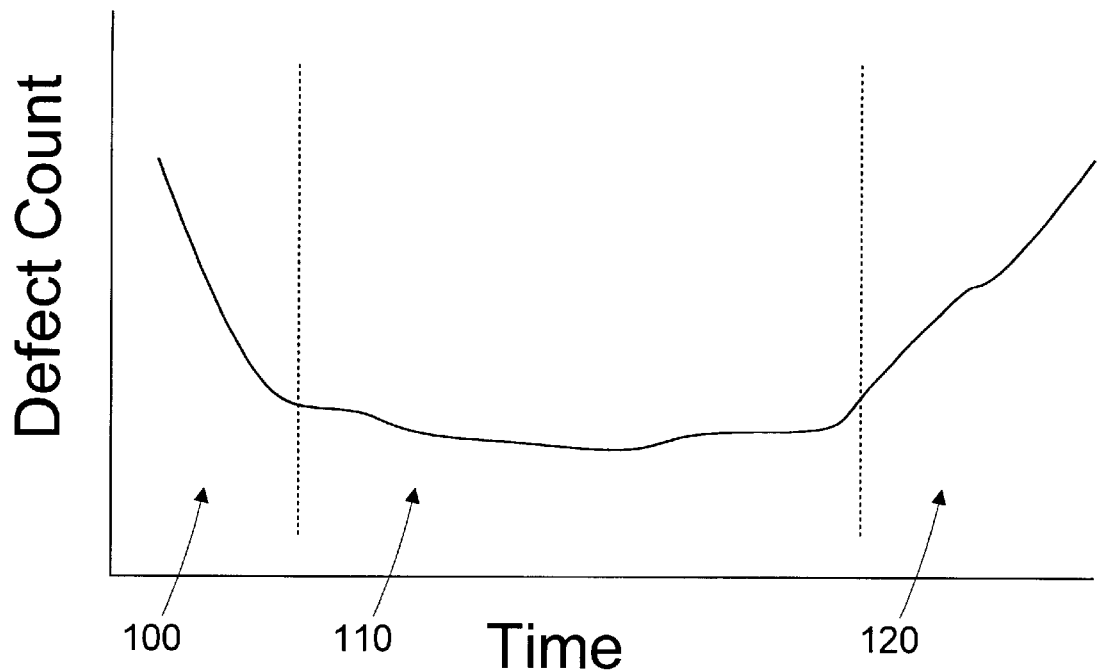
FIG. 2 is a defect count curve for a deposition tool of FIG. 1 following a cleaning or refurbishmnent.

FIG. 2 illustrates a defect count curve for a deposition tool following a cleaning or refurbishment. In an initial period 100, the defect count may be high. During the initial period 100, the measurement frequency of the measurement tool 40 is increased as compared to its default value. A steady-state period 110 follows the initial period 100, and the measurement frequency of the measurement tool 40 is decreased to the default value. Finally, as the age of the hardware increases, an end-of-life period 120 is entered where the defect count again may increase. During the end-of-life period 120, the measurement frequency of the measurement tool 40 is again increased. The transition times between the steady-state period 110 and the initial and end-of-life periods 100, 120 are not completely predictable. The determination of the times to transition from one period 100, 110, 120 to another may be based on predetermined time frames or, alternatively based on the performance measurements themselves. The particular frequencies for the initial period 100 and the end-of-life period 120 may not necessarily be the same.

For example, if during the initial period 100, where the measurement tool 40 is measuring at an increased frequency, and the automatic process controller 50 detects a sustained decrease in the defect count, the automatic process controller 50 directs the measurement tool 40 to transition to the default frequency. Likewise, if the measurement tool 40 is measuring at the default frequency, and the automatic process controller 50 detects a sustained increase in the defect count, the automatic process controller 50 directs the measurement tool 40 to transition to the increased frequency.

Figure 3:
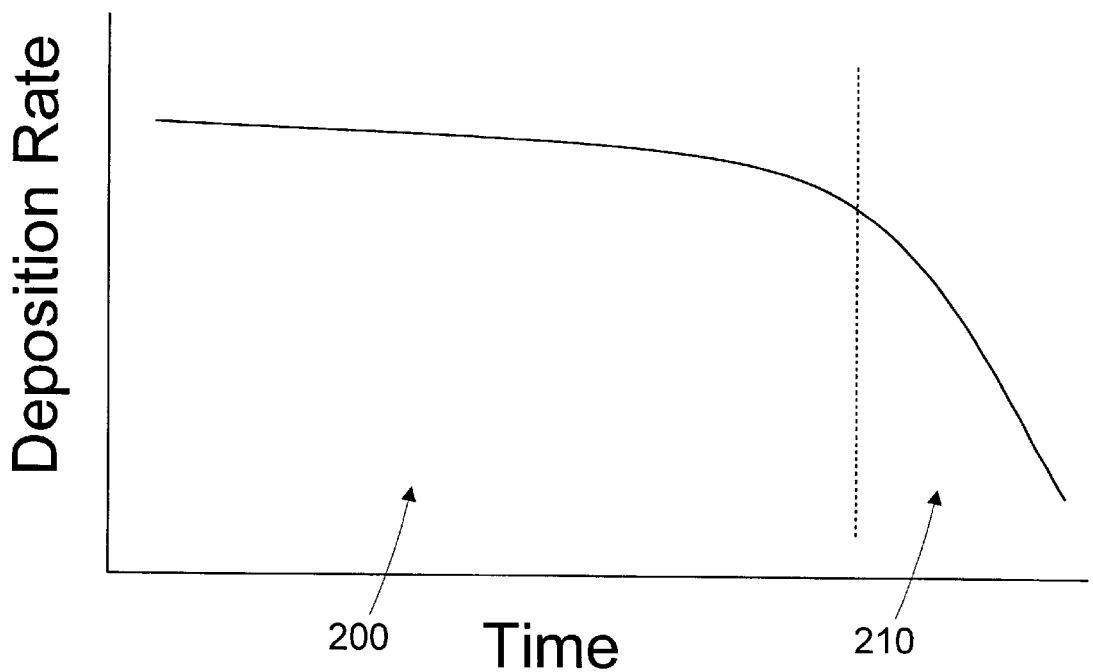
FIG. 3 is a deposition rate curve for the deposition tool of FIG. 1 following a cleaning or part replacement.

FIG. 3 illustrates a deposition rate curve for a deposition tool following a cleaning or showerhead replacement. In an initial period 200, the deposition rate is generally stable. During the initial period 200, the measurement frequency of the measurement tool 40 is set by the automatic process controller 50 to the default frequency. Over time, as material builds up on the processing tool 20, the target is depleted, or the in-line filter becomes obstructed, the deposition rate decreases. The period marked by a marked decrease in deposition rate is the end-of-life period 210. During the end-of-life period 120, the measurement frequency of the automatic process controller increases the measurement frequency of the measurement tool 40 to the increased value.

The transition to the increased frequency could be used to trigger an alert or message to an operator of the processing tool 20 to evaluate the conditions and possibly schedule a maintenance task. Using such an approach, the maintenance interval could be effectively lengthened when the transition to the higher frequency occurs at a point in time later than the expected time for entering the end-of-life interval 120, 210. This approach identifies both early degraded conditions as well as conditions more favorable than predicted where maintenance intervals can be extended.

The specific frequencies for the default frequency and the increased frequency are application dependent. For example, the default frequency may be every N lots, every shift, every month, etc. The increased frequency may be some multiple (e.g., two or three times) the default frequency.

It is contemplated that the automatic process controller 50 may be configured to adaptively change the frequency and or transition times based on the actual history of the measurement tool 40. For example, the automatic process controller 50 may attempt maintain a constant ratio between the percent failed and the percent measured. That is, during periods with a low number of failures the frequency may be adaptively decreased. Likewise, during periods with higher rates, the frequency may be adaptively increased. In such an embodiment, there may not be distinct intervals, but rather a continuum of adaptively changing measurement frequencies based on the current failure rate.

The automatic process controller 50 may be adapted to change the measurement frequency of the measurement tool 40 to identify a number of degraded conditions. For example, the automatic process controller 50 may increase the measurement frequency around times of expected cleanings, target replacement, shower-head replacement, and in-line filter replacement. These intervals may or may not overlap.

Figure 4:
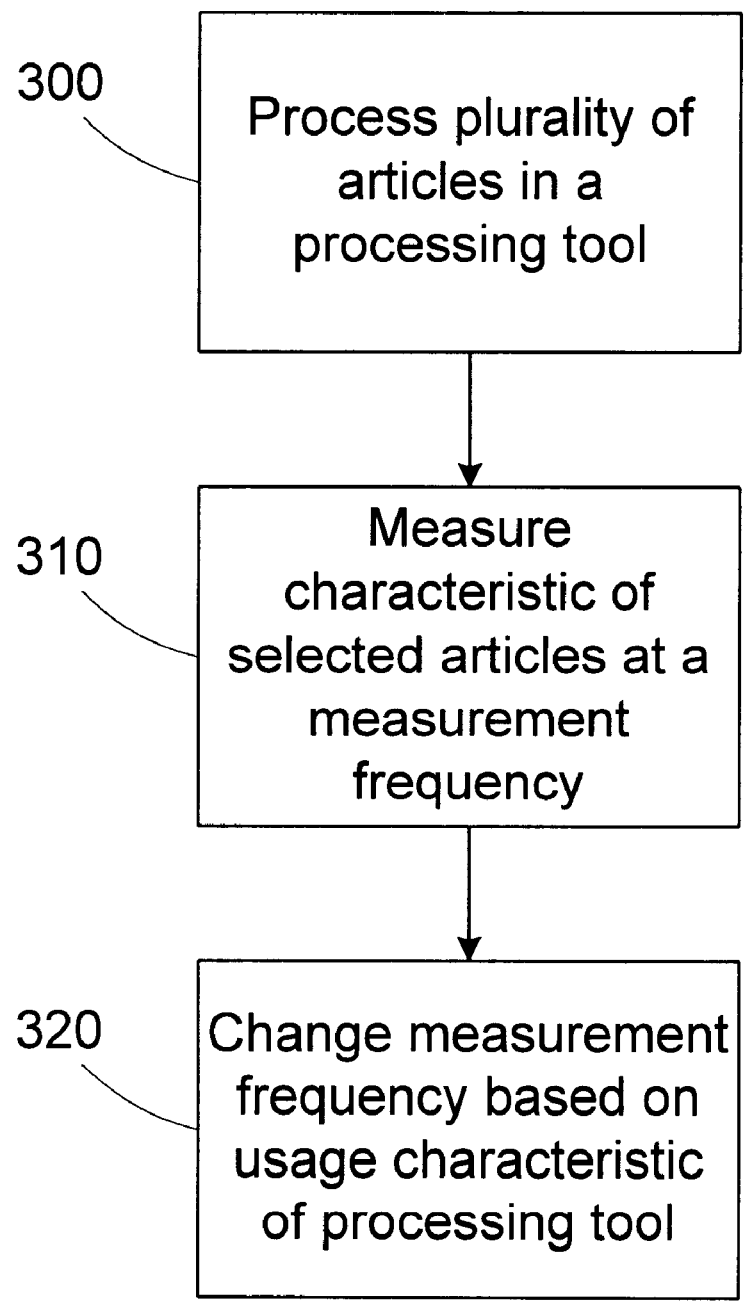
FIG. 4 is a flow diagram of a method for monitoring a processing tool in accordance with the present invention.

Turning now to FIG. 4, a flow diagram of a method for monitoring a processing tool 20 is provided. In block 300, a plurality of articles are processed in the processing tool 20. In block 310, a characteristic of selected articles is measured at a measurement frequency The measurement frequency is changed based on a usage characteristic of the processing tool 20, in block 320.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A processing line, comprising:

a processing tool adapted to process articles;

a measurement tool adapted to measure a characteristic of selected articles at a measurement frequency; and an automatic process controller adapted to change the measurement frequency based on a usage characteristic of the processing tool.

2. The processing line of claim 1, wherein the automatic process controller is adapted to set the measurement frequency at a first frequency during a first time period and set the measurement frequency at a second frequency during a second time period.

3. The processing line of claim 2, wherein one of the first and second frequencies is a default frequency and the other of the first and second frequencies is a frequency higher than the default frequency.

4. The processing line of claim 2, wherein the automatic process controller is adapted to transition from the first time period to the second time period based on a predetermined time.

5. The processing line of claim 2, wherein the automatic process controller is adapted to transition from the first time period to the second time period based on the characteristic measured by the measuring tool.

6. The processing line of claim 1, wherein the articles comprise semiconductor wafers.

7. The processing line of claim 6, wherein the processing tool is adapted to form a layer of material on the wafers, and the characteristic comprises at least one of a thickness of the layer of material, a resistivity of the layer of material, and a defect count associated with the layer of material.

8. The processing line of claim 1, wherein the usage characteristic comprises a period of time elapsed since a preventative maintenance task has been performed on the processing tool.

9. The processing line of claim 1, wherein the usage characteristic comprises a period of time elapsed since a particular part in the processing tool has been replaced.

10. A method for monitoring a processing tool, comprising:

processing a plurality of articles in the processing tool;

measuring a characteristic of selected articles at a measurement frequency; and changing the measurement frequency based on a usage characteristic of the processing tool.

11. The method of claim 10, wherein changing the measurement frequency includes setting the measurement frequency at a first frequency during a first time period, and setting the measurement frequency at a second frequency during a second time period.

12. The method of claim 11, wherein setting the measurement at one of the first and second frequencies includes setting one of the first and second frequencies at a default frequency and setting the other of the first and second frequencies at a frequency higher than the default frequency.

13. The method of claim 11, wherein setting the measurement frequency at a second frequency includes setting the measurement frequency at a second frequency after a predetermined period of time.

14. The method of claim 11, wherein setting the measurement frequency at a second frequency includes setting the measurement frequency at a second frequency based on the characteristic measured.

15. The method of claim 11, wherein processing the plurality of articles comprises processing a plurality of semiconductor wafers.

16. The method of claim 15, wherein the processing tool is adapted to form a layer of material on the wafers, and measuring the characteristic comprises measuring at least one of a thickness of the layer of material, a resistivity of the layer of material, and a defect count associated with the layer of material.

17. The method of claim 10, wherein changing the measurement frequency based on the usage characteristic of the processing tool comprises changing the measurement frequency based on a period of time elapsed since a preventative maintenance task has been performed on the processing tool.

18. The method of claim 10, wherein changing the measurement frequency based on the usage characteristic of the processing tool comprises changing the measurement frequency based on a period of time elapsed since a particular part in the processing tool has been replaced.

19. An apparatus for monitoring a processing tool adapted to process a plurality of articles, comprising:

means for measuring a characteristic of selected articles at a measurement frequency; and means for changing the measurement frequency based on a usage characteristic of the processing tool.

* * * * *